United States Patent [19]

Golla et al.

[11] Patent Number: 5,627,790

[45] Date of Patent: May 6, 1997

[54] READING CIRCUIT FOR AN INTEGRATED SEMICONDUCTOR MEMORY DEVICE

[75] Inventors: Carla M. Golla, Sesto San Giovanni; Marco Olivo, Bergamo; Silvia Padoan, Rimini, all of Italy

[73] Assignee: SGS-Thomson Microelectronics S.r.l., Agrate Brianza, Italy

[21] Appl. No.: 408,589

[22] Filed: Mar. 22, 1995

[30] Foreign Application Priority Data

Mar. 22, 1994 [EP] European Pat. Off. ............... 94830124

[51] Int. Cl.$^6$ .................................................. G11C 7/02
[52] U.S. Cl. .................. 365/210; 365/185.2; 365/185.21; 365/189.09
[58] Field of Search .......................... 365/185.21, 210, 365/189.09, 185.2

[56] References Cited

U.S. PATENT DOCUMENTS

| | | | |
|---|---|---|---|
| 5,142,495 | 8/1992 | Canepa | 365/189.09 |
| 5,293,345 | 3/1994 | Iwahashi | 365/185.21 |

FOREIGN PATENT DOCUMENTS

| | | | |
|---|---|---|---|
| 0031643A1 | 7/1981 | European Pat. Off. | G11C 17/00 |
| 0576045A2 | 12/1993 | European Pat. Off. | G11C 16/06 |

OTHER PUBLICATIONS

Atsumi et al, "Fast Programmable 256K Read Only Memory with On-Chip Test Circuits", *IEEE Transactions on Electron Devices*, vol. Ed-32, No. 2, Feb. 1985, New York, pp. 502-507.

*Primary Examiner*—David C. Nelms
*Assistant Examiner*—F. Niranjan
*Attorney, Agent, or Firm*—David V. Carlson; Harry K. Ahn; Seed and Berry LLP

[57] ABSTRACT

A device including a load connected by a selection circuit to a number of bit lines, and a load connected to a reference cell, for detecting the current in the selected bit line and in the reference cell. The load connected to the bit lines comprises a transistor, and the reference load comprises two current paths, each formed by one transistor. One of the two transistors is diode-connected, and the other is switchable by a switching network connected to the gate terminal of the respective transistor, for turning it off when only one reference current path is to be enabled, and for diode-connecting it when both the reference current paths are to be enabled.

25 Claims, 1 Drawing Sheet

READING CIRCUIT FOR AN INTEGRATED SEMICONDUCTOR MEMORY DEVICE

TECHNICAL FIELD

The present invention relates to a memory array cell reading device.

BACKGROUND OF THE INVENTION

As is known, all currently marketed types of memory read array cells by comparing the content of the cells with a known content of a selected reference cell. A memory of this type is illustrated in FIG. 1. This figure shows a memory cell 1, whose content is to be read, connected (together with other cells not shown) to a bit line 2. Bit line 2 is connected to a selection circuit 4 which is in turn connected to an array branch 3 forming part of the reading device and comprising a current/voltage converter 5. Selection circuit 4 comprises pass transistors, and receives a decoding signal DEC for selectively enabling read operations by connecting/ disconnecting bit line 2 to/from converter 5. Converter 5 comprises a precharge circuit 6 and a load 7 connected in series between selection circuit 4 and a supply line $V_{CC}$. Node 8, positioned between precharge circuit 6 and load 7, constitutes the output of array branch 3 and is connected to one input of a single- or two-stage sense amplifier 10 having another input connected to the output 11 of a reference branch 12 with the same structure as array branch 3.

More specifically, reference branch 12 comprises a current/voltage converter 14 and a precharge circuit 16. Converter 14 comprises a load 15 connected between supply line $V_{CC}$ and precharge circuit 16. The precharge circuit 16 is connected to a reference cell 17 (whose content, or state, is known) via a selection simulating circuit 18 also comprising a pass transistor, the gate terminal of which is so biased as to maintain an active connection between reference cell 17 and converter 14.

In known manner, the memory array comprises n array reading branches 3 (one for each output of the reading device plus a redundancy branch) and one reference branch 12.

In the FIG. 1 arrangement, converters 5, 14 detect the currents through read cell 1 and reference cell 17 respectively, and convert them into a voltage. More specifically, the current along bit line 2, and hence through load 7, depends on the state (programmed or erased) of cell 1, whereas the current in reference branch 12 is known; and the two voltages at outputs 8, 11 are then compared in amplifier 10.

For the array cells to be read correctly, the reference branch, with the exception of the load must be as similar as possible to the array branch. The reference branch load is normally formed by two or more identical current paths to the supply, so that, if the read cell is erased, the reference current (through reference cell 17) equals or is twice or a multiple of the current through the array branch.

According to one known solution, the load of all the array branches is formed by a diode-connected MOS transistor, and the reference branch comprises two MOS transistors of the same type as the array branch transistors, also diode-connected, and connected in parallel between node 11 and supply line $V_{CC}$. Also, as some situations require that one of the current paths of the reference branch be turned off, so that the reference current equals the current through an erased array cell, the switchable current path typically includes a controlled switch in the form of a MOS transistor. This MOS transistor is typically connected in series with the respective load transistor. To achieve a correct relationship between the reference and array branch currents, the current paths must be the same, so similar transistors (simulating controlled switches and of the same size and characteristics) must be provided along the other current path of the reference branch and along each array branch, which additional transistors are so biased as to be permanently on.

As the additional transistors must be large to operate effectively as switches, and must be provided in all the array branches, the above solution is extremely cumbersome.

SUMMARY OF THE INVENTION

It is an object of the present invention to provide a memory reading device which is compact, while at the same time providing for equal current paths, and the possibility of switching one or more of the paths. According to the present invention, there is provided a memory array cell reading device. In a preferred embodiment of the present invention, one current path of the reference branch is formed by a single diode-connected load transistor, and the other current path by a single load transistor switchable by a switching network driven by at least one external signal and located between the gate and drain terminals of the switchable single load transistor. In this manner, the switchable load transistor is turned off when the second current path is to be disabled, and is diode-connected when the second current path is to be enabled.

DETAILED DESCRIPTION OF THE INVENTION

Figure 1:
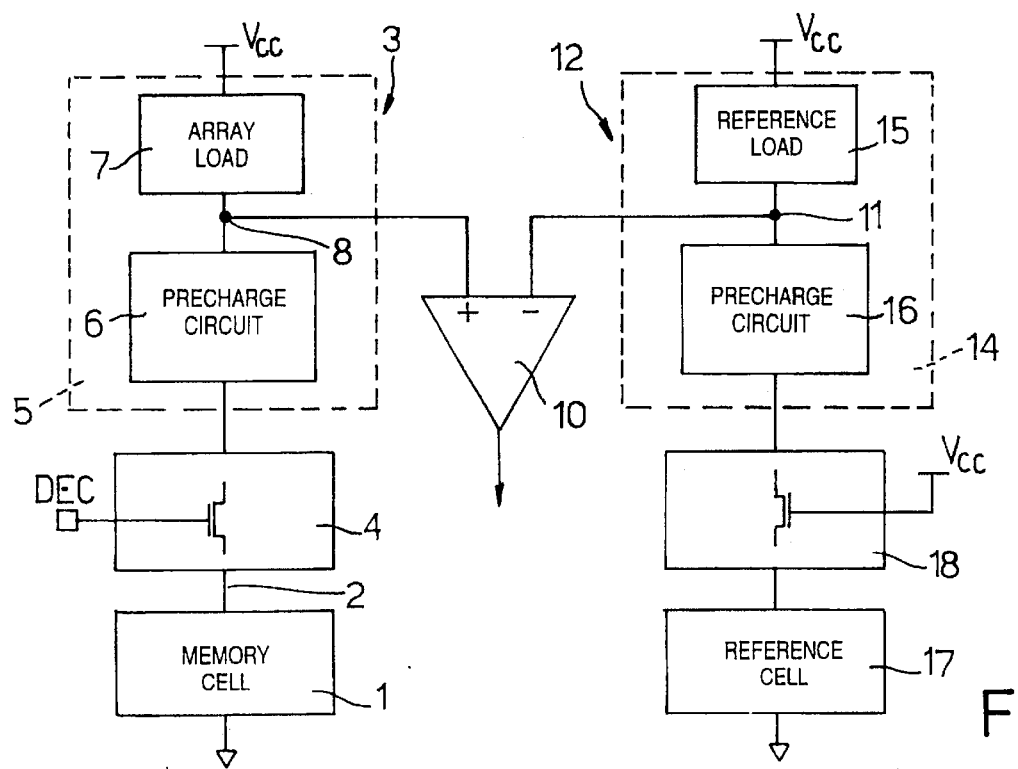
FIG. 1 shows a known type of reading device.
Figure 2:
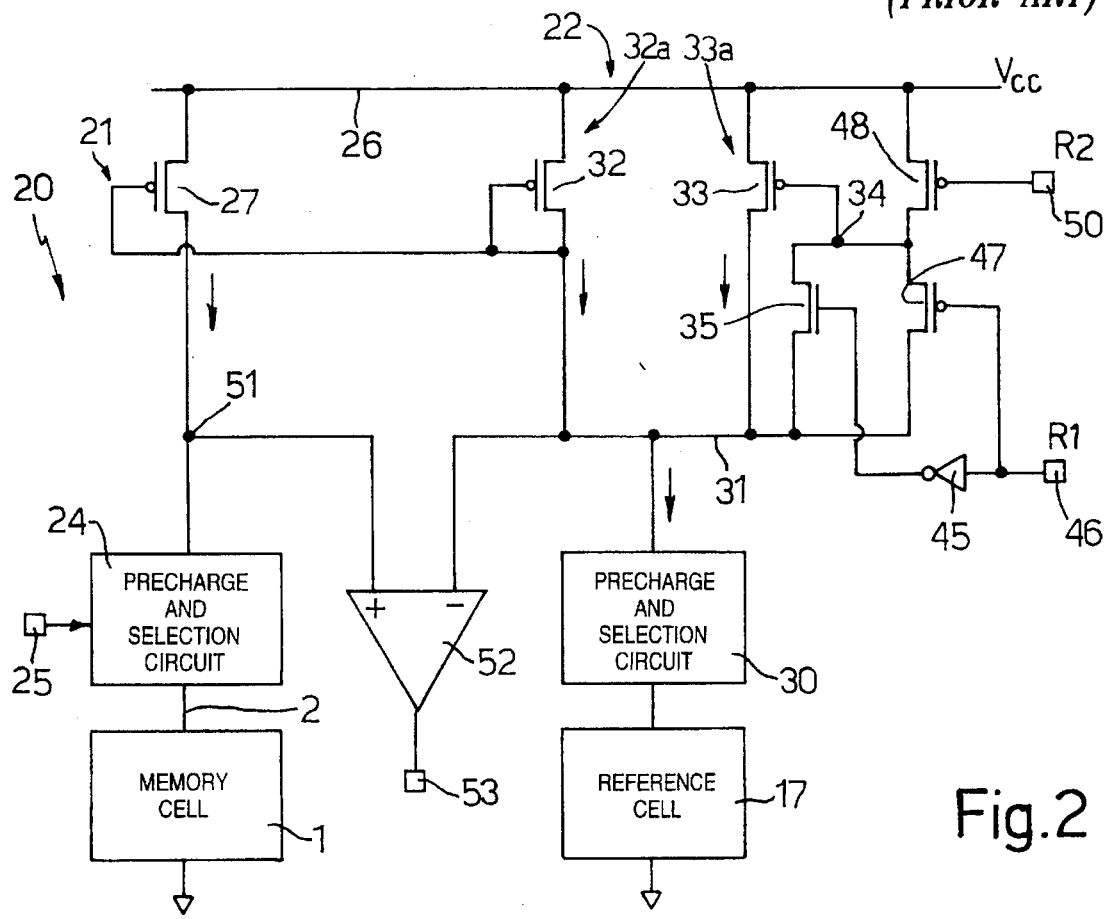
FIG. 2 shows an electric diagram of one embodiment of the device according to the present invention.

In FIG. 2, the reading device is indicated by 20 and, like the known device in FIG. 1, comprises a number of array reading branches 21 (only one shown) and a reference branch 22. The array reading branch 21 comprises a precharge and selection circuit 24 (similar to circuits 4, 5 in FIG. 1) connected to a bit line 2 to which the cell 1 to be read is also connected. Like circuit 4, precharge and selection circuit 24 presents an input 25 supplied with a decoding signal DEC, and is connected to a $V_{CC}$ supply line 26 via a load formed by a P-channel MOS transistor 27.

Similarly, reference branch 22 comprises a precharge and selection circuit 30 connected to reference cell 17 and to a reference line 31. Between reference line 31 and supply line 26, there are provided two current paths 32a, 33a formed by respective loads 32, 33 in the form of P-channel transistors of the same size and fabrication specifications as transistor 27.

More specifically, transistor 32 has its gate terminal short-circuited to its drain terminal and has its gate and its drain terminals connected to the gate terminal of load transistor 27 of array branch 21. Transistor 32 also has its gate and drain terminals connected to reference line 31. Transistor 33 has its gate terminal (defining node 34) connected to reference line 31 via a first N-channel selection transistor 35. The gate terminal of first selection transistor 35 is connected to the output of an inverter 45, the input of which constitutes an input node 46 of circuit 20 supplying a logic signal R1 that is switchable between supply line potential and zero. Input node 46 is also connected to the gate terminal of a second, P-channel, selection transistor 47. The second selection transistor has its source terminal connected to node 34, and its drain terminal connected to reference line 31. A third, P-channel, selection transistor 48 is interposed between supply line 26 and node 34. The gate terminal of the third selection transistor 48 defines an input node 50 supplying a second logic selection signal R2.

Like the FIG. 1 device, node 51 (defined by the drain terminal of load transistor 27 of array branch 21) and reference line 31 are connected to respective inputs of a sense amplifier 52, the output 53 of which defines the output of circuit 20.

The channels of selection transistors 35, 47, 48 have a high width-to-length ratio (W/L ratio) so that they are highly conductive.

Circuit 20 in FIG. 2 operates as follows.

When both selection signals R1, R2 are low, transistors 48, 47 are turned on and bring reference line 31 to supply voltage $V_{CC}$. Conversely, load transistor 33 and selection transistor 35 are off due to the insufficient voltage drop between their source and gate terminals. More specifically, selection transistor 35 has the supply voltage at both the gate terminal connected to the output of inverter 45, and the source terminal connected to reference line 31. Analogously, load transistor 33 has the supply voltage at both its source terminal connected to line 26, and its gate terminal. The above operating condition is desired to bring device 20 rapidly to the operating condition prior to reading the cell.

When selection signal R1 is high and R2 low, selection transistors 35, 47 are off and selection transistor 48 is on. In this scenario, selection transistor 48 connects node 34 to supply line 26 so that load transistor 33, whose gate and source terminals are short-circuited, is off. As a result, only current path 32a is enabled, and reading is performed with the same current in the reference and array branches. In fact, the connection between the gate terminals of load transistor 27 of array branch 21 and load transistor 32 of reference branch 22 ensures both branches operate under the same conditions.

When selection signal R1 is low and R2 high, selection transistor 48 is off and selection transistor 35 or 47 is turned on depending on the voltage of reference line 31. More specifically, prior to reading the cell, in a known manner, the reference line is at supply voltage $V_{CC}$. In this scenario, selection transistor 35 is turned off by presenting the same potential at the source and gate terminals. Conversely, transistor 47 is turned on and couples the gate terminal of load transistor 33 to reference line 31. Transistor 33 is thus in the same operating condition as load transistors 27, 32, and its current is added to that of transistor 32 (both current paths 32a, 33a are enabled) to supply reference cell 17 with a current 2I, where I is the current supplied singly by transistors 27, 32, 33.

During reading, the potential of reference line 31 falls, in a known manner, due to the reference cell being conductive. As the potential falls so that the voltage drop between the source and gate terminals of selection transistor 35 reaches its threshold value, transistor 35 is turned on and connection between the gate terminal of load transistor 33 and reference line 31 is assured by both transistors 35, 47. As the potential of reference line 31 (and hence at node 34) falls, the voltage drop between the source and gate terminals of transistor 47 eventually falls below the threshold value, and transistor 47 is turned off. As a result, the diode connection of load transistor 33 is assured solely by selection transistor 35. Throughout the cell reading phase, therefore, the reference branch provides for supplying twice the current of a conductive array cell.

A configuration wherein both selection signals R1, R2 are high is not permitted.

The advantages of the device described are many. For example, as compared with the prior art method that comprises two transistors (one load transistor and an additional switching transistor) connected in series for each current path, the present invention provides a device that is more compact by eliminating one transistor per array branch. Moreover, the solution described is both simple and reliable.

The detailed discussion provided above illustrates only one preferred embodiment of the present invention. This discussion will enable those skilled in the art to make various modifications that do not depart from the spirit and the scope of the present invention. Accordingly, the present invention contemplates all such modifications that read on the appended claims and equivalents thereof.

We claim:

1. A memory array cell reading device comprising:
at least one array branch and a reference branch wherein said array branch comprises an array load element interposed between a voltage potential line and an array output node and defining an array current path, and said reference branch comprises at least a first reference load element and a second reference load element interposed, parallel to each other, between said voltage potential line and a reference output node and defining a first and second reference current path;
wherein at least said second reference current path comprises switching means, wherein said array and reference current paths each comprise one transistor element with a control terminal, and wherein said control terminal of said transistor element of said second reference current path defines a turn-on terminal connected to said switching means for selectively disabling said transistor element of said second reference current path such that only the current through said first reference path is provided to said reference output node.

2. A memory array cell reading device comprising:
at least one array branch and a reference branch wherein said array branch comprises an array load element interposed between a voltage potential line and an array output node and defining an array current path, and said reference branch comprises at least a first reference load element and a second reference load element interposed, parallel to each other, between said voltage potential line and a reference output node and defining a first and second reference current path;
wherein at least said second reference current path comprises switching means, wherein said array and reference current paths each comprise one transistor element with a control terminal, and wherein said control terminal of said transistor element of said second reference current path defines a turn-on terminal connected to said switching means for enabling and disabling said transistor element of said second reference current path; and
wherein said switching means comprises at least a first controlled switch interposed between a common line and said turn-on terminal, and wherein said control terminals of said transistor elements of said array current path and said first reference current path are connected to said common line.

3. A device as claimed in claim 2 wherein said switching means comprises at least a second controlled switch interposed between said turn-on terminal and a bias line at a potential for turning off said transistor element of said second reference current path.

4. A device as claimed in claim 3 wherein said switching means comprises a third controlled switch interposed between said turn-on terminal and said reference output node.

5. A device as claimed in claim 4 wherein said controlled switches comprise transistors, each having a control terminal supplied with a respective switching signal.

6. A device as claimed in claim 5 wherein said load transistor elements comprise P-channel MOS transistors, wherein said common line forms said reference output node, and wherein said bias line is formed by said voltage potential line.

7. A device as claimed in claim 6 wherein said first and second controlled switches each comprises a P-channel MOS transistor, wherein said third controlled switch comprises an N-channel MOS transistor, wherein said first controlled switch is controlled by a first control signal, and wherein said third controlled switch is controlled by a second control signal in phase opposition with respect to said first control signal.

8. A memory array cell reading device comprising:
   at least one array branch connected between a voltage source and an array output node, and including a transistor providing a load to the array branch;
   a reference branch including
      a first reference load element connected between the voltage source and a reference output node, and including a first transistor providing a load to the first reference load element; and
      a second reference load element connected in parallel with the first reference load element, and including a second transistor providing a load to the second reference load element, the second transistor having a control terminal that defines a turn-on terminal; and
   a switch connected to the turn-on terminal operable to selectively switch the second transistor to cut off a current flowing therethrough such that only the current through the first reference load element is provided to the reference output node.

9. The device according to claim 8, further comprising a sense amplifier having a first input connected to the array output node and a second input connected to the reference output node.

10. A memory array cell reading device comprising:
    at least one array branch connected between a voltage source and an array outpost node, and including a transistor providing a load to the array branch;
    a reference branch including
       a first reference load element connected between the voltage source and a reference output node, and including a first transistor providing a load to the first reference load element; and
       a second reference load element connected in parallel with the first reference load element, and including a second transistor providing a load to the second reference load element, the second transistor having a control terminal that defines a turn-on terminal;
    a switching circuit connected to the turn-on terminal for switching the second transistor to cut off a current flowing therethrough; and
    wherein the control terminals of the array branch transistor and the first transistor are connected to each other to provide the array branch transistor and the first transistor with similar operating characteristics.

11. The device according to claim 10 wherein the switching circuit comprises a first switch connected between the reference output node and the turn-on terminal.

12. The device according to claim 11 wherein the switching circuit further comprises a second switch connected between a bias line and the turn-on terminal, a potential of the bias line being sufficient to be able to turn off the second transistor.

13. The device according to claim 12 wherein the switching circuit further comprises a third switch connected between the turn-on terminal and the reference output node.

14. The device according to claim 13 wherein each of the first, second, and third switches comprises a transistor.

15. The device according to claim 14 wherein the array branch transistor, the first transistor and the second transistor each comprises a P-channel MOS transistor and the bias line is formed by the voltage source.

16. The device according to claim 15 wherein the first and second switches each comprises a P-channel MOS transistor, and the third switch comprises an N-channel MOS transistor, the first switch being controlled by a first control signal, the third switch being controlled by a second control signal operating at an opposite logic level from the logic level of the first control signal.

17. A device as claimed in claim 1 wherein said switching means comprises at least a first controlled switch interposed between a common line and said turn-on terminal, and wherein said control terminals of said transistor elements of said array current path and said first reference current path are connected to said common line.

18. A device as claimed in claim 17 wherein said switching means comprises at least a second controlled switch interposed between said turn-on terminal and a bias line at a potential for turning off said transistor element of said second reference current path.

19. A device as claimed in claim 18 wherein said switching means comprises a third controlled switch interposed between said turn-on terminal and said reference output node.

20. A device as claimed in claim 19 wherein said controlled switches comprise transistors, each having a control terminal supplied with a respective switching signal.

21. The device according to claim 8 wherein the control terminals of the array branch transistor and the first transistor are connected to each other to provide the array branch transistor and the first transistor with similar operating characteristics.

22. The device according to claim 8 wherein the switch comprises a first transistor connected between the voltage source and the turn-on terminal, and operable to turn off the second transistor of the reference branch.

23. The device according to claim 22 wherein the switch further comprises a second transistor connected between the reference output node and the turn-on terminal.

24. The device according to claim 23 wherein the switch further comprises a third transistor connected between the turn-on terminal and the reference output node.

25. A memory array cell reading device comprising:
    an array branch connected between a voltage source and an array output node, and including an array load element;
    a reference branch including
       a first reference load element connected between the voltage source and a reference output node; and
       a second reference load element connected in parallel with the first reference load element, the second reference load element having a control terminal that defines a turn-on terminal; and
    a disabling circuit connected to the turn-on terminal operable to selectively disable the second reference load element to cut off a current flowing therethrough such that only the current through the first reference load element is provided to the reference output node.

* * * * *